(12) United States Patent
Klingel et al.

(10) Patent No.: US 9,164,148 B2
(45) Date of Patent: Oct. 20, 2015

(54) SYSTEMS AND METHODS FOR DETECTING OVER/UNDER EXCITATION FAULTS

(71) Applicant: Emerson Electric Company, St. Louis, MO (US)

(72) Inventors: John Charles Klingel, North Mankato, MN (US); Allen Edward Windhorn, Kasota, MN (US); Jacob Robert Bjorke, Mankato, MN (US); Kory Michael Meyers, Mankato, MN (US)

(73) Assignee: KATO ENGINEERING INC., North Mankato, MN (US)

( * ) Notice: Subject to any disclaimer, the term of this patent is extended or adjusted under 35 U.S.C. 154(b) by 237 days.

(21) Appl. No.: 13/862,061

(22) Filed: Apr. 12, 2013

(65) Prior Publication Data
US 2014/0307357 A1   Oct. 16, 2014

(51) Int. Cl.
| | |
|---|---|
| *G01R 31/02* | (2006.01) |
| *H02H 3/00* | (2006.01) |
| *G01R 31/34* | (2006.01) |
| *H02H 7/06* | (2006.01) |
| *G01R 19/12* | (2006.01) |

(52) U.S. Cl.
CPC .......... *G01R 31/343* (2013.01); *H02H 7/062* (2013.01); *H02H 7/065* (2013.01); *G01R 19/12* (2013.01)

(58) Field of Classification Search
CPC ............. H02J 3/00; H02J 3/005; H02J 3/06; H02J 3/12; H02J 3/16; H02J 3/18; H02J 3/1885; H02J 3/38; H02J 2003/388
USPC .......................................................... 361/86
See application file for complete search history.

(56) References Cited

U.S. PATENT DOCUMENTS

| | | | |
|---|---|---|---|
| 2,717,318 | A | 9/1955 | Keith et al. |
| 2,883,561 | A | 4/1959 | Reeder et al. |
| 2,917,672 | A | 12/1959 | Tremaine |
| 4,245,182 | A | 1/1981 | Aotsu et al. |
| 4,402,028 | A * | 8/1983 | Udren ............................ 367/36 |
| 6,265,852 | B1 | 7/2001 | Kitamura et al. |
| 6,525,504 | B1 | 2/2003 | Nygren et al. |
| 6,762,592 | B2 | 7/2004 | Noguchi et al. |
| 6,847,184 | B2 | 1/2005 | Noguchi et al. |

(Continued)

FOREIGN PATENT DOCUMENTS

WO   WO-2012/065666   5/2012

OTHER PUBLICATIONS

Dromey Design Inc., Synchronous Generation in Distribution Systems, 2007, 8 pages.
Mozina et al., Coordination of Generator Protection with Generator Excitation Control and Generator Capability, IEEE Power Engineering Society General Meeting, 2007, 17 pages.
Rockefeller et al., Generator Protection Application Guide, Basler Electric Company, Apr. 1994, 28 pages.

(Continued)

*Primary Examiner* — Thienvu Tran
*Assistant Examiner* — Kevin J Comber
(74) *Attorney, Agent, or Firm* — Foley & Lardner LLP

(57) ABSTRACT

System, methods, and computer-readable storage media that may be used to detect excitation faults for electrical devices, such as generators and/or condensers, connected in a parallel configuration are provided. A method includes determining a change in a terminal voltage of one of the electrical devices with respect to a steady state terminal voltage. The method further includes determining a change in a reactive power of the electrical device with respect to a steady state reactive power. The method further includes determining whether an excitation fault condition exists based on the determined changes in terminal voltage and reactive power.

19 Claims, 12 Drawing Sheets

(56) References Cited

U.S. PATENT DOCUMENTS

| | | |
|---|---|---|
| 6,919,712 B1 | 7/2005 | Kitamura et al. |
| 7,345,456 B2 | 3/2008 | Gibbs et al. |
| 7,710,693 B2 | 5/2010 | Guzman-Casillas et al. |
| 2008/0290666 A1* | 11/2008 | Bourgeau et al. .......... 290/40 A |

OTHER PUBLICATIONS

Usta et al., A New Relaying Algorithm to Detect Loss of Excitation of Synchronous Generators, Turk J Elec Engin, vol. 15, No. 3, 2007, 11 pages.

\* cited by examiner

Import VARS (Load Dump)

Import VARS (Failed AVR)

SYSTEMS AND METHODS FOR DETECTING OVER/UNDER EXCITATION FAULTS

BACKGROUND

The present disclosure relates generally to the field of protection systems for electrical devices. More particularly, the present disclosure relates to systems of and methods for detecting excitation fault conditions associated with an electrical device, such as a generator or condenser (e.g., synchronous condenser).

Electrical systems often include multiple electrical devices, such as generators and/or synchronous condensers to form or support a single power source. Multiple devices may be connected in parallel to form a single electrical power source, or (e.g., in the case of synchronous condensers) connected to a single electrical power source. A single electrical bus may be formed by connecting several (e.g., many) devices to the power source. However, a failure of one of the electrical devices can compromise the integrity of the entire power bus. In some instances, failure of a single device may cause cascading failures across entire groups of devices connected to the bus. Some systems may utilize protection devices to detect failures and take measures to prevent the failures from affecting other connected devices.

SUMMARY

One embodiment of the disclosure relates to a method that includes determining, at a sensor electrically connected to an electrical device, a change in a terminal voltage of the electrical device with respect to a steady state terminal voltage of the electrical device. The electrical device is one of a plurality of electrical devices connected in a parallel configuration. The sensor includes at least one processing circuit. The method further includes determining, at the sensor, a change in a reactive power of the electrical device with respect to a steady state reactive power of the electrical device. The method further includes determining, at the sensor, whether an excitation fault condition exists based on the determined changes in terminal voltage and reactive power.

Another embodiment relates to a system that includes a processing circuit configured to determine a change in a terminal voltage of an electrical device with respect to a steady state terminal voltage of the electrical device. The electrical device is one of a plurality of electrical devices connected in a parallel configuration. The processing circuit is further configured to determine a change in a reactive power of the electrical device with respect to a steady state reactive power of the electrical device. The processing circuit is further configured to determine whether an excitation fault condition exists based on the determined changes in terminal voltage and reactive power.

Another embodiment relates to one or more machine-readable storage media having instructions stored thereon. The instructions are executable by one or more processors to execute operations including determining a change in a terminal voltage of the generator with respect to a steady state terminal voltage of the generator. The generator is one of a plurality of generators connected in a parallel configuration. The operations further include determining a change in a reactive power of the generator with respect to a steady state reactive power of the generator. The operations further include determining whether an excitation fault condition exists based on the determined changes in terminal voltage and reactive power. Determining whether an excitation fault condition exists includes determining that an overexcitation fault condition exists when both the terminal voltage and the reactive power are increasing, determining that an underexcitation fault condition exists when both the terminal voltage and the reactive power are decreasing, and determining that an excitation fault condition does not exist when either (a) the terminal voltage is increasing and the reactive power is decreasing, or (b) the terminal voltage is decreasing and the reactive power is increasing.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Figure 1:
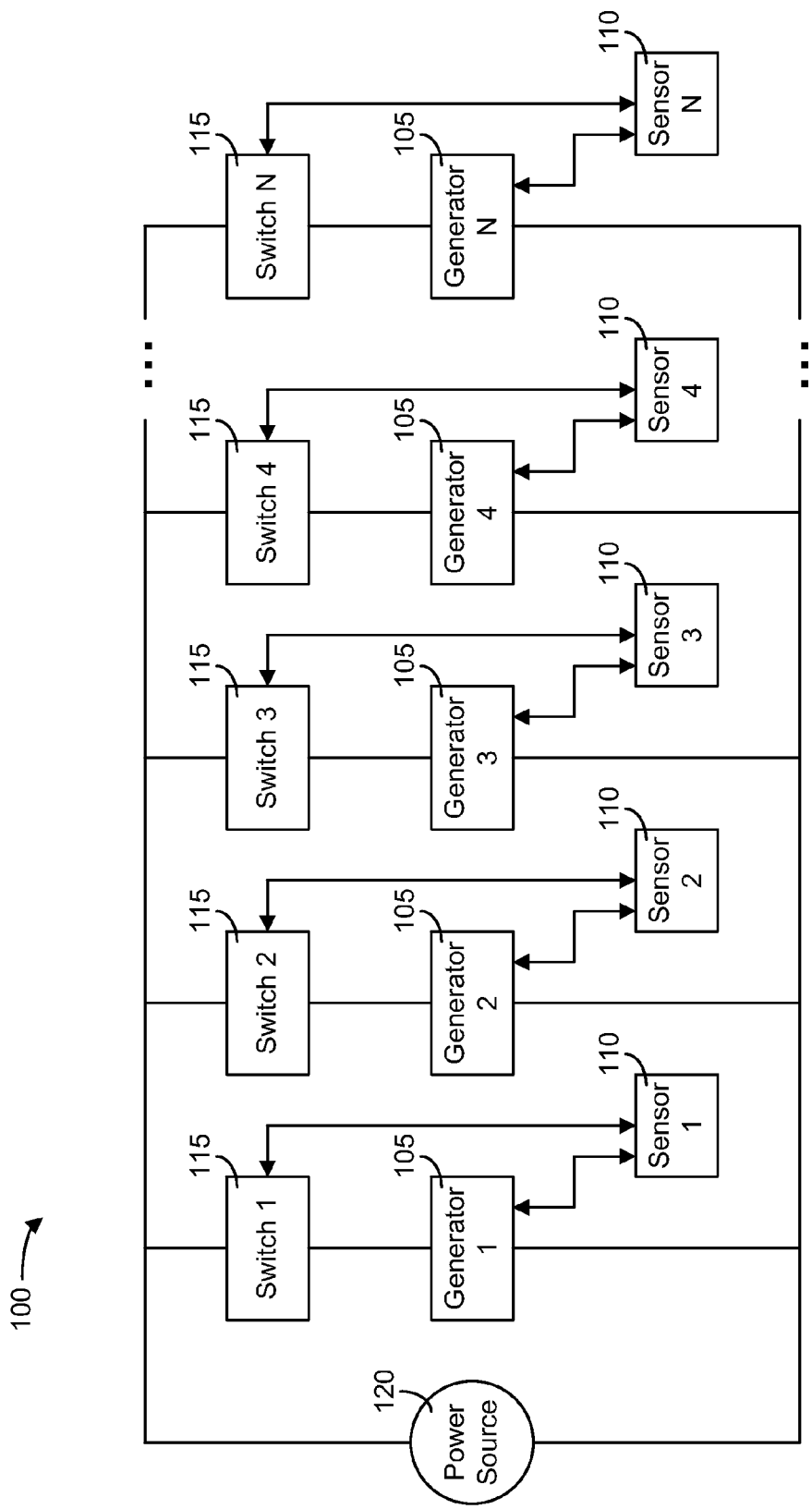
FIG. 1 is a block diagram of a system including several generators connected in a parallel configuration according to an exemplary embodiment.

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods for protecting electrical devices connected in parallel are provided according to exemplary embodiments. Protection systems may be used to detect faults associated with an individual electrical device and remove the electrical device from the circuit before the failure impacts other devices connected to the circuit. By removing the faulted device from the paralleled bus quickly, critical loads connected to the bus may remain powered and operational even in the event of a failure with one device.

Some systems detect failures by comparing a parameter or characteristic associated with a single device with a parameter or characteristic associated with many or all devices connected to the parallel bus. For example, some systems employ a "cross-current" signal representing cumulative output current across the entire bus (and their respective phase relationships to the output voltage of the device being analyzed). A sensor may determine the unbalance in reactive current flow (e.g., through the cross-current network and the device's voltage signal) and terminal voltage movement to determine which device has an excitation fault. This requires sensors associated with each of the devices to be electrically interconnected with the other devices (e.g., to be capable of monitoring the power lines of adjacent devices, such as by using current transformers) so that the sensors can make comparisons based on cumulative and/or comparative measurements between multiple devices on the bus. Such systems may require special connections between parallel devices on the bus to take these measurements. In systems where the parallel devices are separated by large distances, connecting sensing signals between the parallel devices may be difficult or prohibitive.

The present disclosure provides systems and methods that provide for fault detection without requiring a sensor monitoring a particular device to be electrically connected to neighboring devices to monitor signals of the other devices. A sensor device may be connected to an electrical device that is connected to other electrical devices in a parallel configuration. The sensor device may determine or measure a change in the terminal voltage associated with the electrical device and a change in the reactive power associated with the electrical device. The sensor device may use these changes to determine whether or not an excitation fault exists in the device. In some embodiments, if the terminal voltage and the reactive power are both increasing or both decreasing, a fault is determined to exist, and if the terminal voltage and the reactive power are trending in opposite directions (i.e., the terminal voltage is decreasing and the reactive power is increasing, or the terminal voltage is increasing and the reactive power is decreasing), no fault is determined to exist. In some embodiments, if both the terminal voltage and the reactive power are increasing, an overexcitation fault condition is detected, and if both the terminal voltage and the reactive power are decreasing, an underexcitation fault condition is detected. In some embodiments, a rate of change of terminal voltage may be detected and used to determine whether a fault condition exists (e.g., if the rate of change exceeds a threshold value, no fault is determined to exist). Once a fault condition is detected, a switching device may be used to remove the faulted device from the parallel bus, an alarm (e.g., audio/visual alarm) may be triggered, and/or another fault response may be activated. In some embodiments, the systems and methods provided herein may allow for monitoring of excitation fault conditions without directly connecting to or monitoring the excitation field itself (e.g., the main field or exciter field current).

Referring now to FIG. 1, a block diagram of a system 100 including several generators 105 (e.g., synchronous generators) connected to a power source 120 in a parallel configuration is shown according to an exemplary embodiment. A power bus may connect each of generators 105 to power source 120 and to one another in parallel. While FIG. 1 and other exemplary embodiments disclosed herein reference generators, it should be understood that the features of the disclosure may be applied equally to various other types of electrical devices, such as condensers (e.g., synchronous condensers). The embodiments disclosed herein may be used with electrical devices in a parallel configuration in any type or scope of application, such as a local group of devices (e.g., grouped within a single location, such as a vehicle or a building) or a power grid (e.g., an isolated micro grid and/or a national or wide-area power grid).

In the illustrated exemplary embodiment, each generator 105 may be monitored by a sensor 110. Sensor 110 may be a device configured to monitor one or more parameters of the generator 105 to which it is coupled to determine if any faults, such as excitation faults, exist that would affect the functioning and continued operation of the coupled generator 105. In some embodiments, a fault may be caused by a failure of an excitation device, such as an Automatic Voltage Regulator (AVR). For example, an AVR failure in which the AVR is producing little or no power causes the terminal voltage of generator 105 to decline and causes generator 105 to increasingly import reactive power (e.g., as measured in volt-amperes reactive, or VARs), or causes a decline in reactive power associated with generator 105. This may be referred to as an underexcitation condition. An AVR failure in which the AVR is producing too much power output (e.g., a full forcing output condition) causes the terminal voltage to increase and generator 105 to export reactive power (e.g., causes an increase in reactive power associated with generator 105). This may be referred to as an overexcitation condition.

In some embodiments, if a fault is detected, sensor 110 may be configured to control a switching device 115 configured to remove the faulted generator 105 from the parallel circuit (e.g., isolate the faulted generator 105 from the power bus). In some embodiments, switching device 115 may be or include a contactor (e.g., three-phase contactor) or other type of electrical switching and/or power isolation device.

Figure 2:
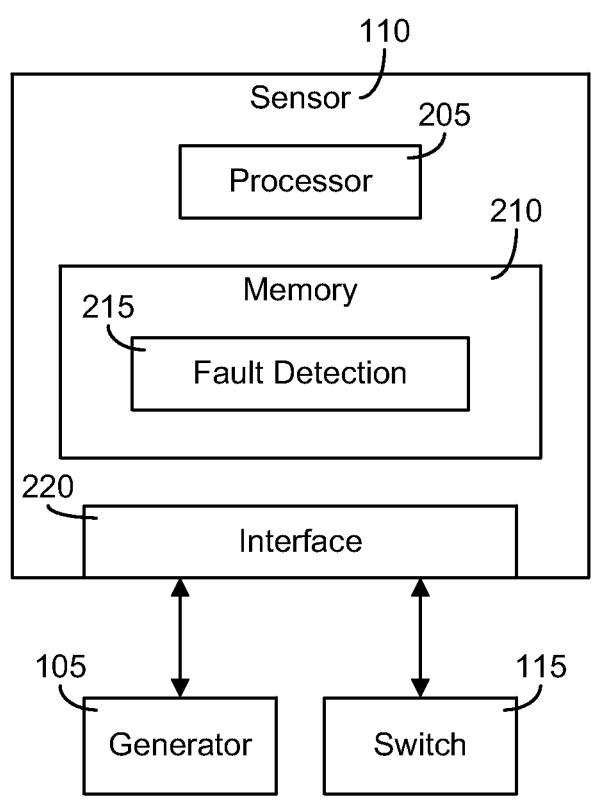
FIG. 2 is a block diagram of a sensor configured to monitor excitation faults of a generator according to an exemplary embodiment.

FIG. 2 illustrates a block diagram of one of the sensors 110 shown in FIG. 1 according to an exemplary embodiment. In some embodiments, sensor 110 may include one or more processors (e.g., a processor 205) and one or more machine-readable storage media (e.g., a memory 210). Processor 205 may include any general purpose or special purpose processor designed to execute instructions stored in memory 210. Memory 210 may include any type of machine-readable storage media (e.g., RAM, ROM, hard disk, flash memory, optical memory, etc.) configured to store instructions and/or other data. In some embodiments, memory 210 may include one or more modules (e.g., software modules including instructions executable by processor 205) configured to implement functions of sensor 110. For example, memory 210 may store a fault detection module 215 configured to detect whether a fault exists for a generator 105 to which sensor 110 is connected. In some embodiments, fault detection module 215 may be configured to actual switching device 115 to disconnect or reconnect generator 105 from the rest of the generators on the parallel bus in response to the detection or clearing of a fault associated with generator 105. An interface 220 of sensor 110 may provide for electrical coupling (e.g., communicative coupling) between sensor 110 and generator 105, switching device 115, and/or other components external to sensor 110. In the illustrated exemplary embodiment, sensor 110 is a digital processing device. In some embodiments, the sensor may be or include analog circuitry and/or mixed analog and digital circuitry configured to perform similar functions.

Figure 3:
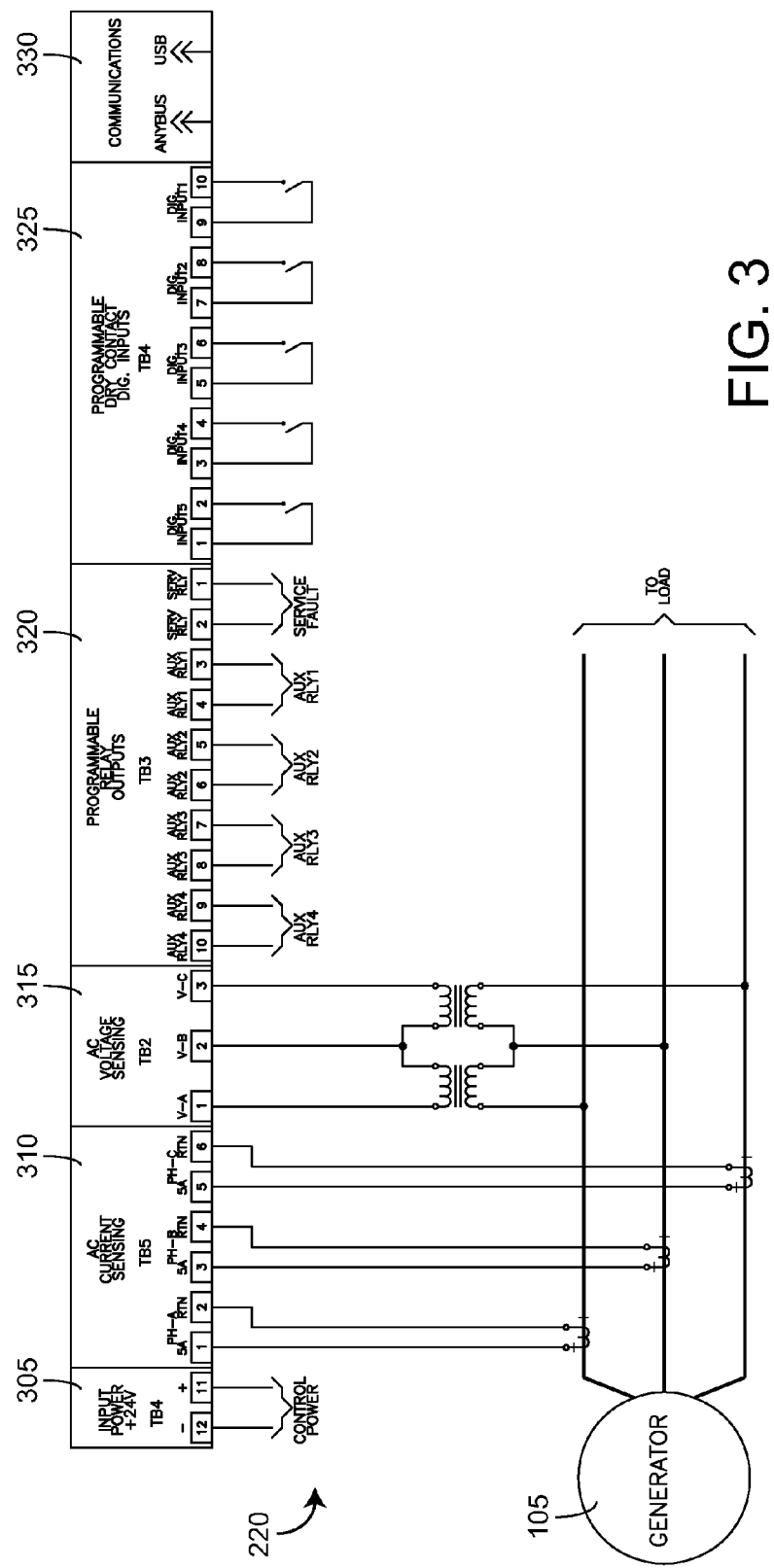
FIG. 3 is a circuit diagram of an interface of the sensor shown in FIG. 2 according to an exemplary embodiment.

FIG. 3 illustrates one sample implementation of interface 220 according to an exemplary embodiment. In the illustrated exemplary embodiment, interface 220 includes an input power interface 305, an AC current sensing interface 310, an AC voltage sensing interface 315, relay output interface 320, digital input interface 325, and communications interface 330. Input power interface 305 is configured to receive control power (e.g., +24V power from a control power bus) for operating sensor 110. AC current sensing interface 310 receives input from one or more devices that are configured to sense currents flowing through each phase of the three-phase generator 105. AC voltage sensing circuit receives input from one or more devices that are configured to measure voltages across the three phases of generator 105. Relay output interface 320 is configured to provide outputs for controlling one or more relay devices (e.g., a relay of switching device 115. Digital input interface 325 may receive one or more digital input values from external devices (e.g., generator 105, switching device 115, other sensors, etc.). Communications interface 330 may enable sensor 110 to communicate with other electronic devices (e.g., via USB, Ethernet, WiFi, or any other wired or wireless communication method).

Referring now generally to FIGS. 4 through 7, illustrations of example terminal voltage and reactive power curves associated with different operating conditions associated with a generator or other electrical device are shown according to exemplary embodiments. FIGS. 4 through 7 illustrate terminal voltage and reactive power behavior in normal operation and fault situations that may be used by a sensor to determine whether or not a fault condition exists.

Figure 4:
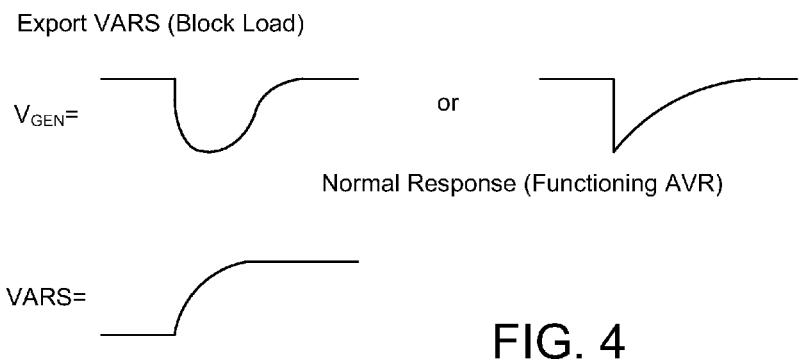
FIG. 4 is an illustration of example terminal voltage and reactive power curves associated with a normal response when a generator is exporting reactive power according to an exemplary embodiment.

Referring specifically to FIG. 4, an illustration of example terminal voltage ($V_{GEN}$) and reactive power (VARS) curves associated with a normal response when a generator is exporting reactive power is shown according to an exemplary embodiment. FIG. 4 may illustrate the terminal voltage and reactive power response associated with a block load, or load on transient, condition (e.g., when a load increases and/or is added onto the generator). As illustrated, when an AVR or other excitation device is functioning properly, the terminal voltage of a synchronous machine operating at a fixed field will decrease as the reactive power is being exported, or is increasing (e.g., decreasing "leading" reactive power to increasing "lagging" reactive power). Normal load transients can cause an abrupt change in the terminal voltage of a synchronous machine, as illustrated in FIG. 4. During normal operations, when the terminal voltage decreases due to increasing load, reactive power is exported, or increases. Generally, if the reactive power on a given synchronous machine remains relatively constant, then the terminal voltage will decrease if the excitation field strength decreases, and the terminal voltage will increase if the field strength increases.

Figure 5:
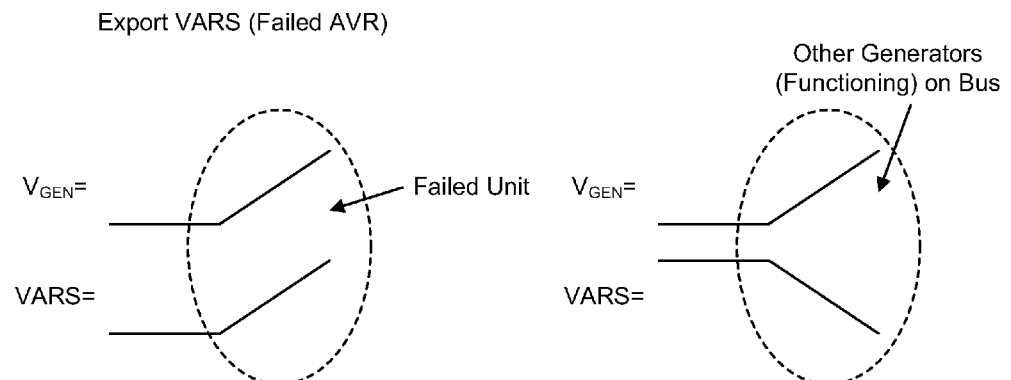
FIG. 5 is an illustration of example terminal voltage and reactive power curves associated with a fault condition when a generator is exporting reactive power, in comparison with corresponding curves of other functioning generators on the same bus, according to an exemplary embodiment.

FIG. 5 illustrates example terminal voltage and reactive power curves associated with a failed AVR causing an overexcitation fault condition according to an exemplary embodiment. The left portion of FIG. 5 illustrates curves associated with the failed unit. As illustrated, during an overexcitation condition, both the terminal voltage and the reactive power associated with the failed generator are increasing. The right portion of FIG. 5 illustrates the reaction of other functioning generators on the parallel power bus, where the terminal voltage is increasing but reactive power is decreasing (being imported) rather than increasing (being exported). As illustrated, failures in field excitation sources exhibit a more gradual change in terminal voltage of a synchronous machine in comparison to normal load changes.

Figure 6:
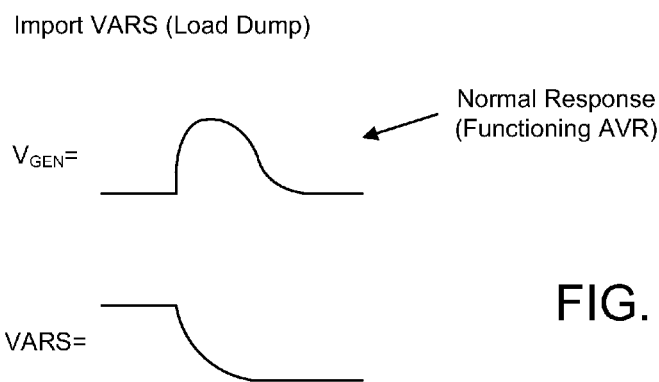
FIG. 6 is an illustration of example terminal voltage and reactive power curves associated with a normal response when a generator is importing reactive power according to an exemplary embodiment.

FIG. 6 illustrates example terminal voltage and reactive power curves associated with a normal response when a generator is importing reactive power, for example in response to a load decreasing or being disconnected from the generator, according to an exemplary embodiment. Due to the dumped or rejected load, the terminal voltage of a normally functioning synchronous machine increases quickly before stabilizing back to the standard terminal voltage. During normal operation, the reactive power decreases, or is imported, with the increase in terminal voltage (e.g., decreasing "lagging" reactive power to increasing "leading" reactive power).

Figure 7:
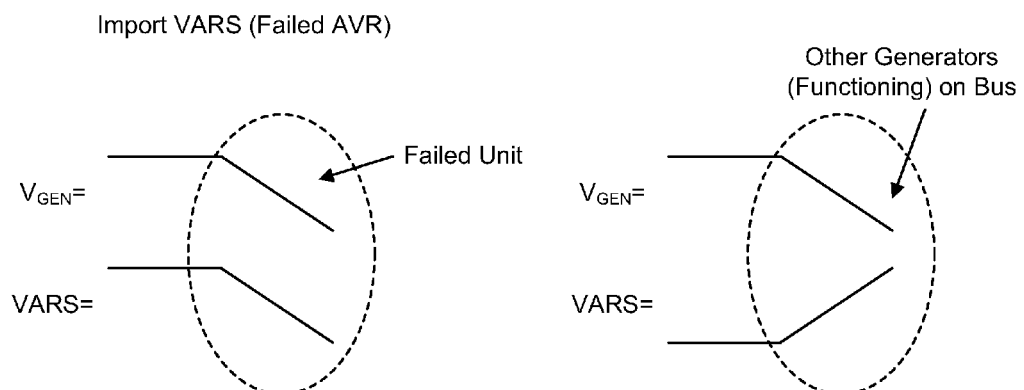
FIG. 7 is an illustration of example terminal voltage and reactive power curves associated with a fault condition when a generator is importing reactive power, in comparison with corresponding curves of other functioning generators on the same bus, according to an exemplary embodiment.

FIG. 7 illustrates example terminal voltage and reactive power curves associated with a failed AVR causing an underexcitation fault condition according to an exemplary embodiment. The left portion of FIG. 7 illustrates curves associated with the failed unit. During an underexcitation condition, both the terminal voltage and the reactive power associated with the failed unit are decreasing. The right portion of FIG. 7 illustrates the reaction of other functioning devices on the parallel power bus, where the terminal voltage is decreasing but the reactive power is increasing (being exported). Again, the excitation fault-based change shown in FIG. 7 is more gradual than the load-based change shown in FIG. 6.

The conditions described above with respect to FIGS. 4 through 7 are summarized in Table 1 below:

TABLE 1

|  | Reactive Power (VARs) Increasing | Reactive Power (VARs) Decreasing |
| --- | --- | --- |
| Terminal Voltage Increasing | Overexcitation (OE) Fault | Normal Operation |
| Terminal Voltage Decreasing | Normal Operation | Underexcitation (UE) Fault |

Figure 8:
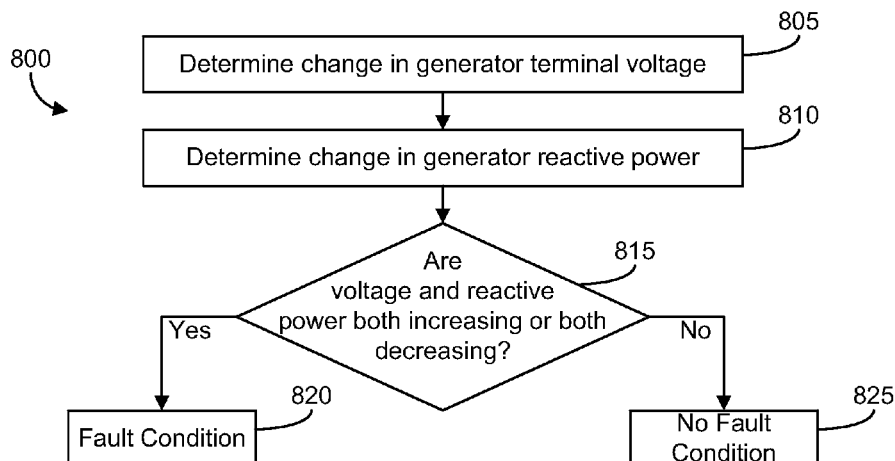
FIG. 8 is a flow diagram of a process for determining whether a fault condition exists for a generator according to an exemplary embodiment.

Referring now to FIG. 8, a flow diagram of a process 800 for determining whether a fault condition exists for an electrical device on a parallel power bus (e.g., a generator) is shown according to an exemplary embodiment. In some embodiments, process 800 may be implemented using a sensor device (e.g., sensor 110) and/or other types of devices described herein.

The sensor may determine a change in generator terminal voltage (805) and a change in generator reactive power (810). In some embodiments, the change in reactive power may be determined by monitoring both the voltages and currents across the three phase power lines (e.g., output lines) associated with the generator (e.g., using lines connecting the generator to the load). The sensor may determine if the terminal voltage and reactive power are both increasing or both decreasing (815). If so, a fault condition is determined to exist (820). As illustrated above in Table 1, an increase in both the terminal voltage and the reactive power is indicative of an overexcitation fault condition. A decrease in both the terminal voltage and the reactive power is indicative of an underexcitation fault condition. If the terminal voltage and the reactive power changes are determined to be trending in opposite directions (i.e., the terminal voltage is increasing while the reactive power is decreasing, or the terminal voltage is decreasing while the reactive power is increasing), no fault condition is determined to exist, and it is determined that the generator is operating normally (825).

Figure 9:
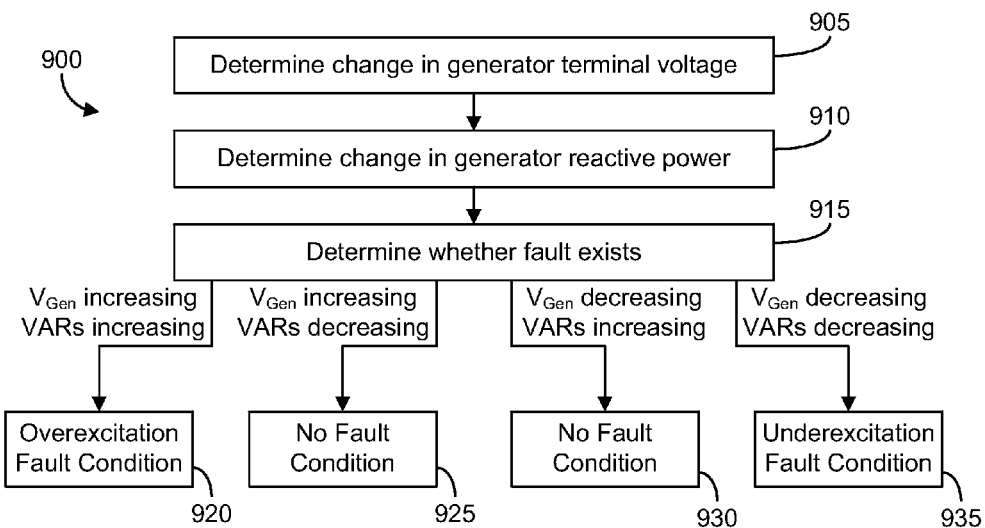
FIG. 9 is a flow diagram of a process for determining whether a fault condition exists for a generator according to another exemplary embodiment.

Referring now to FIG. 9, a flow diagram of another process 900 for determining whether a fault condition exists for an electrical device on a parallel power bus (e.g., a generator) is shown according to an exemplary embodiment. In some embodiments, process 900 may be implemented using a sensor device (e.g., sensor 110) and/or other types of devices described herein.

The sensor may determine a change in generator terminal voltage (905) and a change in generator reactive power (910). The sensor may then determine whether a fault exists based on the determined changes in terminal voltage and reactive power (915). If the generator voltage and the reactive power are both increasing, the sensor may determine that an overexcitation fault condition exists (920). If the generator voltage is increasing while the reactive power is decreasing, the sensor may determine that no fault condition exists (925). Such conditions may be associated with normal operation of the generator in a load blocking situation (e.g., when a load on the generator is added/increased). If the generator voltage is decreasing while the reactive power is increasing, the sensor may again determine that no fault condition exists (930). Such conditions may be associated with normal operation of the generator in a load dumping situation (e.g., when a load on the generator is removed/decreased). If the generator voltage and reactive power are both decreasing, the sensor may determine that an underexcitation fault condition exists (935). When a generator is determined to be subject to an overexcitation or underexcitation condition, in some embodiments, the sensor may control a switching device to remove the generator from the parallel power bus. Once the fault condition is corrected and cleared, the switching device may be controlled to close the circuit and enter the generator back into the parallel power bus.

In some embodiments, the sensor may be configured to determine whether or not a fault condition may exist based in part on a rate of change of terminal voltage for the generator. Referring generally to FIGS. 10 through 13, terminal voltage curves further illustrating terminal voltage behavior during normal and fault conditions are shown according to exemplary embodiments. FIGS. 10 through 13 illustrate how a rate of change, or slope, of the terminal voltage may be used to determine whether a fault condition exists.

Figure 10:
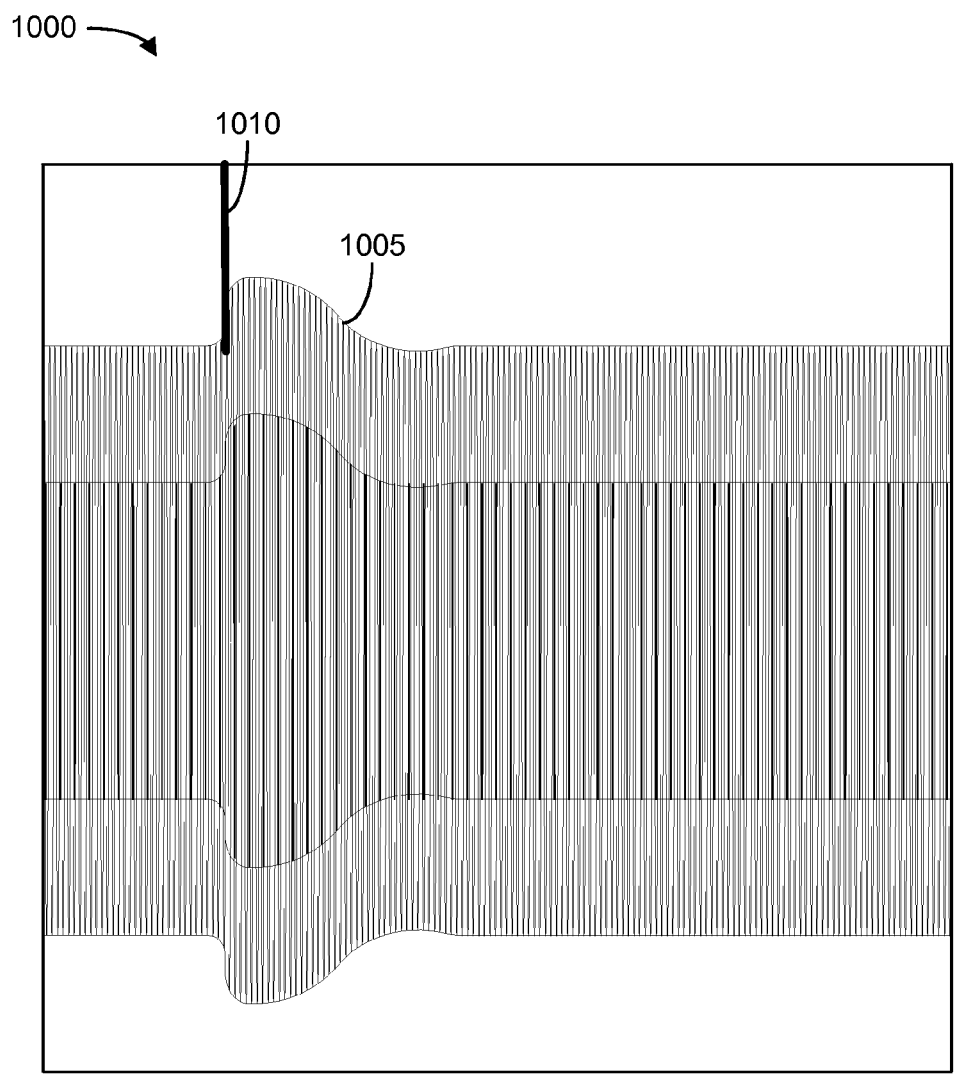
FIG. 10 is a graph illustrating a terminal voltage curve for a generator associated with normal operation according to an exemplary embodiment.

FIG. 10 illustrates a graph 1000 including a terminal voltage curve 1005 associated with normal operation when a load on the generator is removed or reduced (e.g., due to a load transient). A tangential line 1010 has been added to graph 1000 to illustrate the slope of terminal voltage curve 1005 at the point where the terminal voltage spikes due to the change in the load. As can be seen in FIG. 10, line 1010 is very steep, indicating a very high slope or rate of change in the terminal voltage due to the load change.

Figure 11:
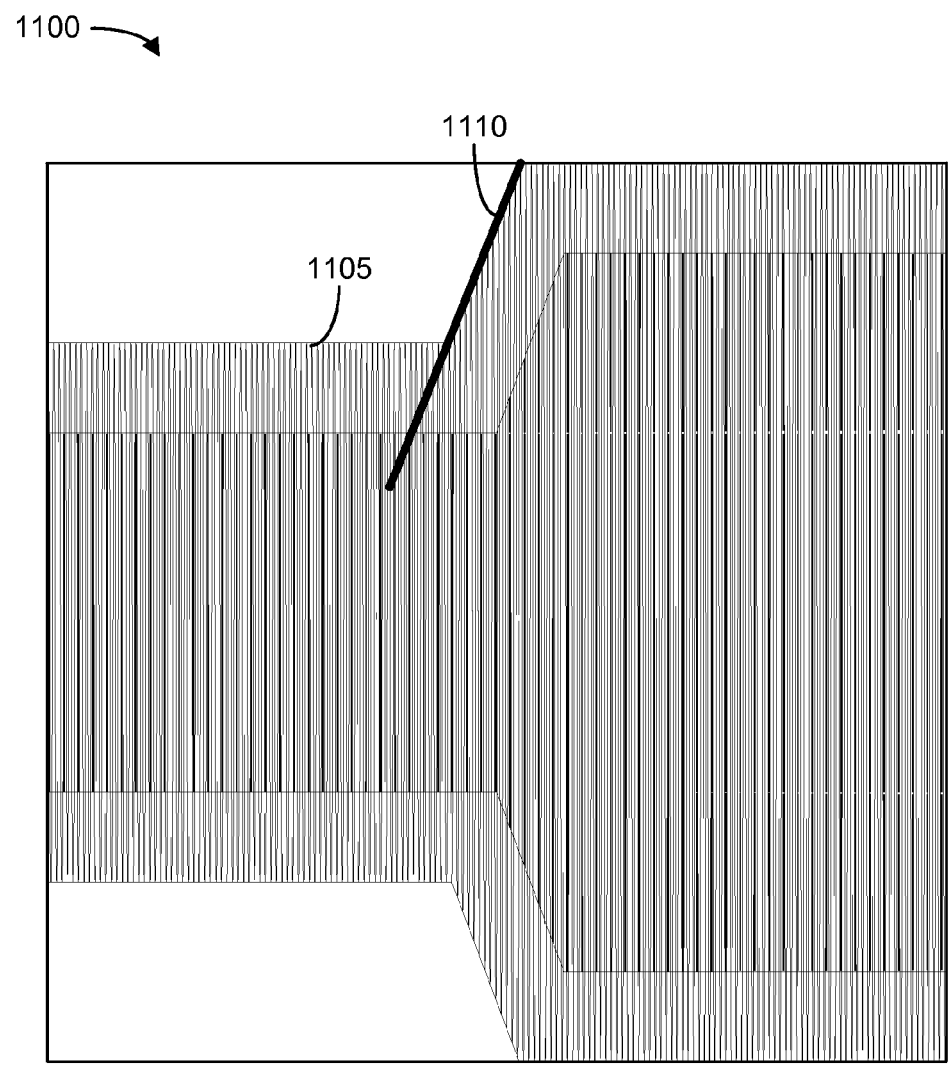
FIG. 11 is a graph illustrating a terminal voltage curve for a generator associated with an overexcitation fault condition according to an exemplary embodiment.

FIG. 11 illustrates a graph 1100 including a terminal voltage curve 1105 associated with an overexcitation fault condition. A tangential line 1110 illustrates the slope of terminal voltage curve 1105 at the point where the terminal voltage changes from a normal or average level. Comparison of lines 1010 and 1110 shows that the increase in the terminal voltage due to load changes during normal operation occurs at a substantially higher rate, or steeper slope, than the more gradual terminal voltage increase associated with the overexcitation fault condition.

Figure 12:
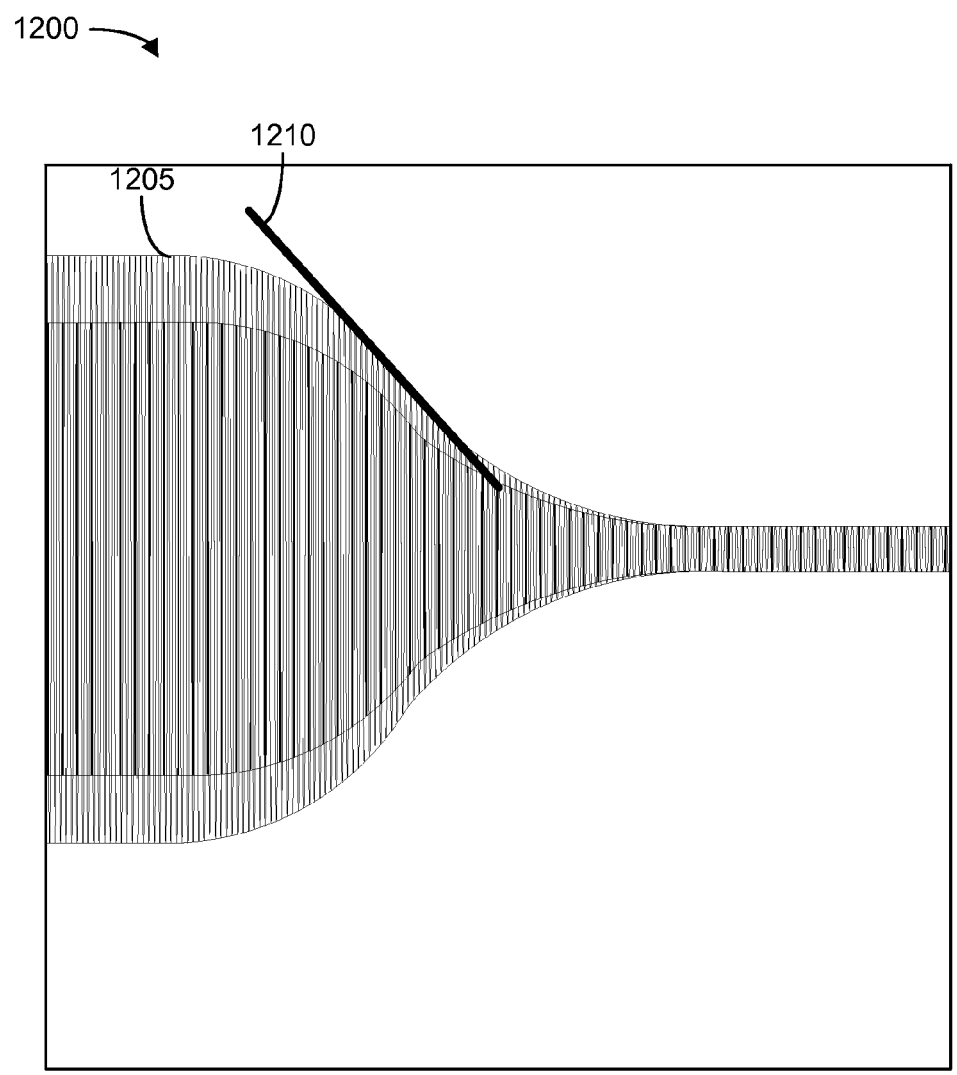
FIG. 12 is a graph illustrating a terminal voltage curve for a generator associated with an underexcitation fault condition according to an exemplary embodiment.
Figure 13:
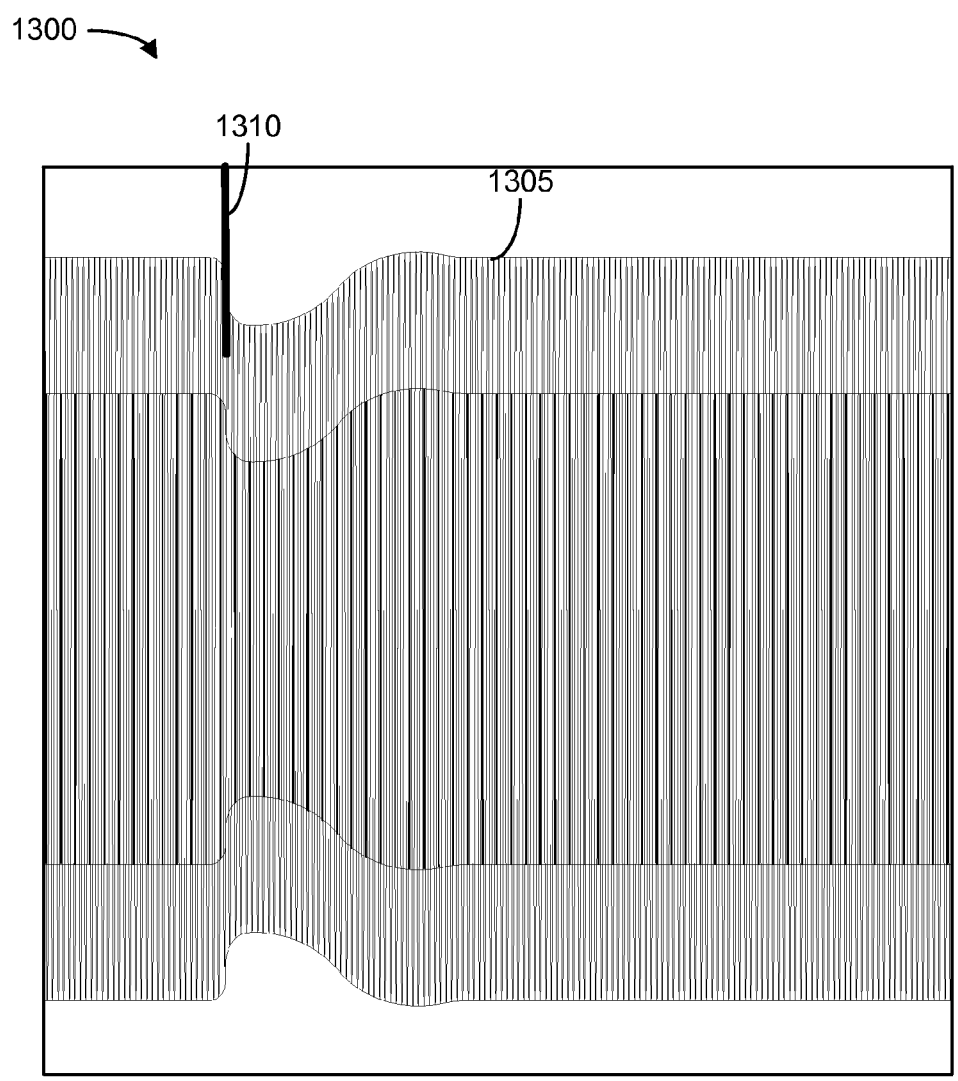
FIG. 13 is a graph illustrating a terminal voltage curve for a generator associated with normal operation according to another exemplary embodiment.

FIG. 12 illustrates a graph 1200 including a terminal voltage curve 1205 associated with an underexcitation fault condition and a tangential line 1210 visually illustrating the rate of change of terminal voltage. Again, the rate of decrease in terminal voltage is relatively gradual when caused by an underexcitation condition. FIG. 13 illustrates a graph 1300 including a terminal voltage curve 1305 associated with load changes during normal operation (e.g., a load on the generator being added/increased, for example due to load transients) and a tangential line 1310 illustrating the rate of change of terminal voltage. Again, the rate of decrease in terminal voltage associated with load changes during normal operation is substantially higher, and the slope is substantially more steep, than the rate of decrease associated with underexcitation.

Figure 14:
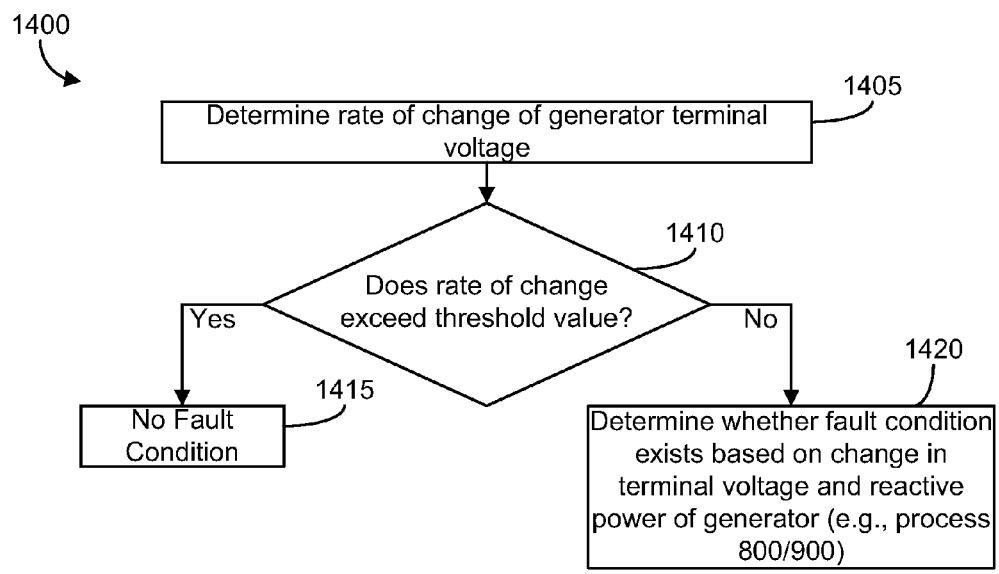
FIG. 14 is a flow diagram of a process for determining whether a fault condition exists for a generator based in part on a rate of change of generator terminal voltage according to an exemplary embodiment.

FIG. 14 illustrates a process 1400 that may utilize the rate of change of terminal voltage to help determine whether or not a fault condition exists according to an exemplary embodiment. In some embodiments, process 1400 may be implemented using a sensor device (e.g., sensor 110) and/or other types of devices described herein.

The sensor may be configured to determine a rate of change of generator terminal voltage upon detecting a terminal voltage change (1405). The sensor may determine if the rate of change exceeds a threshold value (1410). The threshold value may be selected such that it is above a rate of change associated with a fault (e.g., overexcitation or underexcitation) condition but under a rate of change associated with changes in load. If the rate of change exceeds the threshold value, the sensor may determine that no fault condition exists and that the changes are associated with normal operation (e.g., due to load transients or other normal conditions) (1415). If the rate of change does not exceed the threshold value, the sensor may proceed to determine whether a fault condition exists based on the terminal voltage and reactive power associated with the generator (e.g., according to processes 800 and/or 900) (1420).

Figure 15:
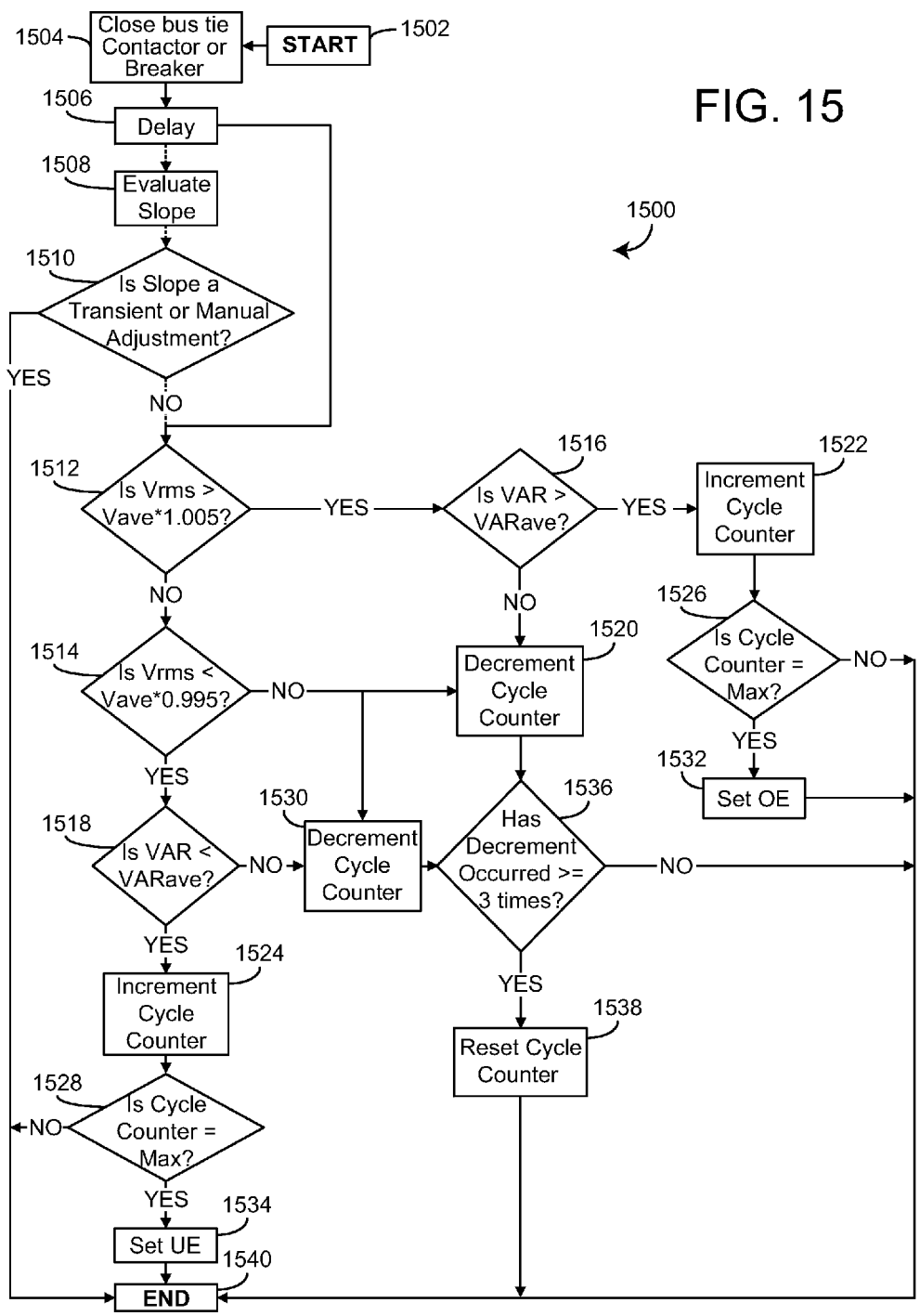
FIG. 15 is a flow diagram of a process for determining whether a fault condition exists for a generator according to another exemplary embodiment.

FIG. 15 illustrates another detailed process 1500 for determining whether one or more faults exist based on a direction of change of the terminal voltage and reactive power according to an exemplary embodiment. In some embodiments, process 1500 may be implemented using a sensor device (e.g., sensor 110) and/or other types of devices described herein.

At a start (1502) of process 1500, a switching device (e.g., bus tie contactor or breaker) may be closed to connect the generator to the parallel power bus (1504). A delay may be used to ensure that the terminal voltage and reactive power have stabilized to a normal (e.g., average or steady-state) level (1506).

In some embodiments, the sensor may optionally initially determine whether a fault condition exists based on a rate of change, or slope, of the terminal voltage. The sensor may evaluate the slope of the terminal voltage to see if the slope exceeds a threshold value (1508). Based on the evaluation, the sensor may determine if the slope is due to a load transient, manual adjustment, or some other type of normal condition (1510). If so, process 1500 ends (1540).

If not, the sensor may proceed with determining whether or not a fault condition exists based on a direction of change in the terminal voltage and reactive power associated with the generator. In some embodiments, an averaging or other combination (e.g., median filter) of values (e.g., voltage/VAR values) may be used to provide a comparison value for changes in the voltage and reactive power values. In some embodiments, Vrms may be used for terminal voltage measurements and comparisons. In some embodiments, several samples (e.g., five) may be taken and averaged. In some embodiments, some of the samples (e.g., high and low outliers) may be discarded prior to averaging the values.

The sensor may determine whether the terminal voltage is greater than the reference (e.g., average) voltage (1512). In some embodiments, the sensor may multiply the reference voltage by a tolerance value (e.g., +5%) to create a window above the reference value to account for minor fluctuations in the terminal voltage.

If the terminal voltage is greater than the reference voltage (including the tolerance factor), the sensor may determine whether the reactive power is greater than a reference reactive power value (e.g., average reactive power) (1516). In some embodiments, this value may also be multiplied by a tolerance factor. If the reactive power is greater than the reference value, the sensor may increment a cycle counter value (1522). The cycle counter may be used to avoid setting fault conditions due to momentary spikes or dips in voltage or reactive power that are not associated with an actual excitation fault. Once the counter is incremented, the sensor determines whether the counter is at a maximum value used to determine the presence of a fault condition (1526). If not, process 1500 ends (1540). If the counter is at the maximum value, the sensor determines that an overexcitation fault condition exists (1532).

If the reactive power is determined not to be greater than the reference value at (1516), then the sensor may determine that the generator is operating normally, and the cycle counter may be decremented (1520). The sensor may determine if the cycle counter has been decremented for more than a threshold number of consecutive cycles (e.g., three cycles) (1536). If so, the cycle counter may be cleared (1538), and process 1500 may end (1540).

If the terminal voltage is not determined to be greater than the reference voltage at (1512), then the sensor may determine whether the terminal voltage is less than the reference voltage (e.g., including a tolerance factor) (1514). If not, the cycle counter may be decremented (1520/1530), and process 1500 may proceed through operations (1536) and (1538) as described above.

If the terminal voltage is less than the reference voltage (including the tolerance factor), the sensor determines whether the reactive power is less than the reference reactive power value (1518). If not, the cycle counter is decremented (1530), and process 1500 may proceed through operations (1536) and (1538) as described above.

If the reactive power is less than the reference value, the cycle counter may be incremented (1524), and the sensor may determine whether the cycle counter is at the maximum value (1528). If not, process 1500 may end (1540). If the cycle counter is at the maximum value, the sensor may determine that an underexcitation fault condition exists (1534). Process 1500 may be repeatedly executed over many cycles to allow the sensor to continuously monitor the generators and determine the occurrence of any excitation faults.

The disclosure is described above with reference to drawings. These drawings illustrate certain details of specific embodiments that implement the systems and methods and programs of the present disclosure. However, describing the disclosure with drawings should not be construed as imposing on the disclosure any limitations that may be present in the drawings. The present disclosure contemplates methods, systems and program products on any machine-readable media for accomplishing its operations. The embodiments of the present disclosure may be implemented using an existing computer processor, or by a special purpose computer processor incorporated for this or another purpose or by a hard-wired system. No claim element herein is to be construed under the provisions of 35 U.S.C. §112, sixth paragraph, unless the element is expressly recited using the phrase "means for." Furthermore, no element, component or method step in the present disclosure is intended to be dedicated to the public, regardless of whether the element, component or method step is explicitly recited in the claims.

As noted above, embodiments within the scope of the present disclosure include program products comprising machine-readable storage media for carrying or having machine-executable instructions or data structures stored thereon. Such machine-readable storage media can be any available media which can be accessed by a general purpose or special purpose computer or other machine with a processor. By way of example, such machine-readable storage media can include RAM, ROM, EPROM, EEPROM, CD ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable storage media. Machine-executable instructions include, for example, instructions and data which cause a general purpose computer, special purpose computer, or special purpose processing machine to perform a certain function or group of functions. Machine or computer-readable storage media, as referenced herein, do not include transitory media (i.e., signals in space).

Embodiments of the disclosure are described in the general context of method steps which may be implemented in one embodiment by a program product including machine-executable instructions, such as program code, for example, in the form of program modules executed by machines in networked environments. Generally, program modules include routines, programs, objects, components, data structures, etc., that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps. Embodiments of the present disclosure may be practiced in a networked environment using logical connections to one or more remote computers having processors. Logical connections may include a local area network (LAN) and a wide area network (WAN) that are presented here by way of example and not limitation.

An exemplary system for implementing the overall system or portions of the disclosure might include a general purpose computing device in the form of a computer, including a processing unit, a system memory, and a system bus that couples various system components including the system memory to the processing unit. The system memory may include read only memory (ROM) and random access memory (RAM) or other non-transitory storage medium. The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD ROM or other optical media. The drives and their associated machine-readable media provide nonvolatile storage of machine-executable instructions, data structures, program modules, and other data for the computer.

It should be noted that although the flowcharts provided herein show a specific order of method steps, it is understood that the order of these steps may differ from what is depicted. Also two or more steps may be performed concurrently or with partial concurrence. Such variation will depend on the software and hardware systems chosen and on designer choice. It is understood that all such variations are within the scope of the disclosure. Likewise, software and web implementations of the present disclosure could be accomplished with standard programming techniques with rule based logic and other logic to accomplish the various database searching steps, correlation steps, comparison steps and decision steps. It should also be noted that the word "component" as used herein and in the claims is intended to encompass implementations using one or more lines of software code, and/or hardware implementations, and/or equipment for receiving manual inputs.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated.

What is claimed is:

1. A method comprising:
    determining, at a sensor electrically connected to an electrical device, a change in a terminal voltage of the electrical device with respect to a steady state terminal voltage of the electrical device, wherein the electrical device is one of a plurality of electrical devices connected in a parallel configuration, and wherein the sensor comprises at least one processing circuit;
    determining, at the sensor, a change in a reactive power of the electrical device with respect to a steady state reactive power of the electrical device;
    determining, at the sensor, whether an excitation fault condition exists based on the determined changes in terminal voltage and reactive power, wherein the sensor is configured to determine whether the excitation fault condition exists by monitoring the terminal voltage and reactive power of the electrical device without monitoring the terminal voltage and reactive power of one or more adjacent electrical devices; and
    in response to determining the excitation fault condition exists, performing at least one of:
        triggering an alarm indicating the excitation fault condition exists; or disconnecting the electrical device from one or more other electrical devices of the plurality of electrical devices.

2. The method of claim 1, wherein determining whether an excitation fault condition exists comprises:
    determining that an excitation fault condition does not exist when either (a) the terminal voltage is increasing and the reactive power is decreasing, or (b) the terminal voltage is decreasing and the reactive power is increasing; and
    determining that an excitation fault condition exists when either (i) both the terminal voltage and the reactive power are increasing, or (ii) both the terminal voltage and the reactive power are decreasing.

3. The method of claim 2, wherein determining that an excitation fault condition exists comprises:
    determining that an overexcitation fault condition exists when both the terminal voltage and the reactive power are increasing; and
    determining that an underexcitation fault condition exists when both the terminal voltage and the reactive power are decreasing.

4. The method of claim 1, wherein the sensor is configured to determine whether an excitation fault condition exists without monitoring an excitation level of an excitation field associated with the electrical device.

5. The method of claim 1, wherein performing the one or more actions in response to determining the excitation fault condition exists comprises disconnecting the electrical device from the rest of the plurality of electrical devices.

6. The method of claim 1, further comprising:
    determining a rate of change in the terminal voltage of the electrical device;
    when the rate of change in the terminal voltage exceeds a threshold rate, determining that an excitation fault condition does not exist; and
    when the rate of change in the terminal voltage does not exceed the threshold rate, determining whether an excitation fault condition exists based on the comparison of the change in the terminal voltage to the change in the reactive power.

7. The method of claim 1, wherein the sensor is electrically connected to two or more of the plurality of electrical devices, and wherein the sensor is configured to determine whether an excitation fault condition exists for each of the two or more electrical devices to which it is connected.

8. The method of claim 1, wherein the plurality of electrical devices comprise at least one of one or more generators and one or more condensers.

9. A system, comprising:
    a processing circuit configured to:
        determine a change in a terminal voltage of an electrical device with respect to a steady state terminal voltage of the electrical device, wherein the electrical device is one of a plurality of electrical devices connected in a parallel configuration;
        determine a change in a reactive power of the electrical device with respect to a steady state reactive power of the electrical device;
        determine whether an excitation fault condition exists based on the determined changes in terminal voltage and reactive power, wherein the processing circuit is further configured to determine whether the excitation fault condition exists by monitoring the terminal voltage and reactive power of the electrical device without monitoring the terminal voltage and reactive power of one or more adjacent electrical devices; and
        in response to determining the excitation fault condition exists, performing at least one of:
            triggering an alarm indicating the excitation fault condition exists; or disconnecting the electrical device from one or more other electrical devices of the plurality of electrical devices.

10. The system of claim 9, wherein the processing circuit is further configured to:
    determine that an excitation fault condition does not exist when either (a) the terminal voltage is increasing and the reactive power is decreasing, or (b) the terminal voltage is decreasing and the reactive power is increasing; and
    determine that an excitation fault condition exists when either (i) both the terminal voltage and the reactive power are increasing, or (ii) both the terminal voltage and the reactive power are decreasing.

11. The system of claim 10, wherein the processing circuit is further configured to:
   determine that an overexcitation fault condition exists when both the terminal voltage and the reactive power are increasing; and
   determine that an underexcitation fault condition exists when both the terminal voltage and the reactive power are decreasing.

12. The system of claim 9, wherein the processing circuit is configured to determine whether an excitation fault condition exists without monitoring an excitation level of an excitation field associated with the electrical device.

13. The system of claim 9, wherein the one or more actions in response to determining the excitation fault condition exists comprise causing a switching device to disconnect the electrical device from the rest of the plurality of electrical devices.

14. The system of claim 9, wherein the processing circuit is further configured to:
   determine a rate of change in the terminal voltage of the electrical device;
   when the rate of change in the terminal voltage exceeds a threshold rate, determine that an excitation fault condition does not exist; and
   when the rate of change in the terminal voltage does not exceed the threshold rate, determine whether an excitation fault condition exists based on the comparison of the change in the terminal voltage to the change in the reactive power.

15. The system of claim 9, wherein the processing circuit is electrically connected to two or more of the plurality of electrical devices, and wherein the processing circuit is configured to determine whether an excitation fault condition exists for each of the two or more electrical devices to which it is connected.

16. The system of claim 9, wherein the plurality of electrical devices comprise at least one of one or more generators and one or more condensers.

17. One or more non-transitory machine-readable storage media having instructions stored thereon, the instructions being executable by one or more processors to execute operations comprising:
   determining a change in a terminal voltage of a generator with respect to a steady state terminal voltage of the generator, wherein the generator is one of a plurality of generators connected in a parallel configuration;
   determining a change in a reactive power of the generator with respect to a steady state reactive power of the generator; and
   determining whether an excitation fault condition exists based on the determined changes in terminal voltage and reactive power, wherein determining whether an excitation fault condition exists comprises:
      determining that an overexcitation fault condition exists when both the terminal voltage and the reactive power are increasing;
      determining that an underexcitation fault condition exists when both the terminal voltage and the reactive power are decreasing;
      determining that an excitation fault condition does not exist when either (a) the terminal voltage is increasing and the reactive power is decreasing, or (b) the terminal voltage is decreasing and the reactive power is increasing, wherein the instructions are configured to cause the processor determine whether an excitation fault condition exists without monitoring an excitation level of an excitation field associated with one or more adjacent generators of the plurality of generators; and
   in response to determining the excitation fault condition exists, performing at least one of:
      triggering an alarm indicating the excitation fault condition exists; or disconnecting the generator from one or more other generators of the plurality of generators.

18. The one or more non-transitory machine-readable storage media of claim 17, wherein the operations further comprise disconnecting the generator from the rest of the plurality of generators when it is determined that an excitation fault condition exists.

19. The one or more non-transitory machine-readable storage media of claim 17, wherein the operations further comprise:
   determining a rate of change in the terminal voltage of the generator;
   when the rate of change in the terminal voltage exceeds a threshold rate, determining that an excitation fault condition does not exist; and
   when the rate of change in the terminal voltage does not exceed the threshold rate, determining whether an excitation fault condition exists based on the comparison of the change in the terminal voltage to the change in the reactive power.

* * * * *